(12) United States Patent
Park

(10) Patent No.: US 7,091,076 B2
(45) Date of Patent: Aug. 15, 2006

(54) METHOD FOR FABRICATING SEMICONDUCTOR DEVICE HAVING FIRST AND SECOND GATE ELECTRODES

(75) Inventor: Geon Ook Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,925

(22) Filed: Dec. 30, 2004

(65) Prior Publication Data

US 2005/0142722 A1    Jun. 30, 2005

(30) Foreign Application Priority Data

Dec. 31, 2003   (KR) .................. 10-2003-0101522

(51) Int. Cl.
*H01L 21/336* (2006.01)

(52) U.S. Cl. .................. 438/197; 438/283; 438/301; 438/585

(58) Field of Classification Search ........... 438/176, 438/177, 187, 277, 229, 283, 284, 299, 301, 438/587, 588
See application file for complete search history.

(56) References Cited

U.S. PATENT DOCUMENTS

| | | | |
|---|---|---|---|
| 5,665,203 A | 9/1997 | Lee et al. | |
| 6,060,741 A | 5/2000 | Huang | |
| 6,165,884 A | 12/2000 | Lee et al. | |
| 6,239,009 B1 * | 5/2001 | Choi et al. | 438/588 |
| 2005/0051843 A1 * | 3/2005 | Inaba | 257/347 |

* cited by examiner

*Primary Examiner*—Jack Chen
(74) *Attorney, Agent, or Firm*—Andrew D. Fortney

(57) ABSTRACT

A method of fabricating a gate electrode used for more flexible device design and higher device integrity is disclosed. A disclosed method comprises: forming a first gate electrode by etching the first insulating layer and the first polysilicon layer; forming a second insulating layer and a second polysilicon layer on the resulting structure; forming a second gate electrode by etching the second polysilicon layer, wherein the longitudinal axes of the first and second gate electrodes cross each other at a predetermined angle; forming a third insulating layer on the resulting structure; and forming source and drain regions by an ion implantation.

14 Claims, 4 Drawing Sheets

METHOD FOR FABRICATING SEMICONDUCTOR DEVICE HAVING FIRST AND SECOND GATE ELECTRODES

BACKGROUND OF THE INVENTION

1. Field of the Invention

The present invention relates to a method for fabricating a gate electrode of a semiconductor device and, more particularly, to a method for fabricating a gate electrode in which source and drain regions can be used independently in need by overlapping a first gate electrode with a second gate electrode.

2. Background of the Related Art

FIG. 1a and FIG. 1b are cross-sectional views illustrating a process of fabricating a gate electrode in accordance with conventional methods.

Referring to FIG. 1a, a gate insulating layer 11, a first conducting layer 12, a first insulating layer 13 and a second insulating layer 14 are sequentially formed on a substrate 10. A gate insulating layer 11 is formed on a substrate 10 with predetermined devices, a first conducting layer 12 for a floating gate electrode is deposited and then a first insulating layer 13 and a second insulating layer 14 are formed to insulate a control gate electrode and the floating gate electrode. Though the gate insulating layer 11 can be made of oxide only or nitride only, the ONO_(Oxide-Nitride-Oxide) structure of upper oxide/nitride/lower oxide is preferably used for the gate insulating layer. Also, the first conducting layer 12 is deposited with silicon, crystallized into polysilicon or single-crystal silicon and etched in a later process to form a floating gate electrode. The first insulating layer 13 is preferably made of oxide and the second insulating layer is preferably made of nitride.

Referring to FIG. 1b, the second insulating layer 14, the first insulating layer 13 and the first conducting layer 12 are sequentially etched to form a gate electrode. The upper part of the second insulating layer 14 is coated with photoresist and a photoresist pattern is formed through exposure and development processes. By using the photoresist pattern as a mask, a floating gate electrode 15 is formed by etching sequentially the second insulating layer 14, the first insulating layer 13 and the first conducting layer 12. The gate insulating layer 11 made of oxide can be used for an etch stop layer during the etching process.

However, the above-described conventional gate forming method has a problem that locations of a source, a drain and a channel are fixed by patterns and locations used for etching a gate insulating layer and a gate electrode. Therefore, types of device designs are limited.

SUMMARY OF THE INVENTION

Accordingly, the present invention is directed to a method for fabricating a gate electrode of a semiconductor device that substantially obviates one or more problems due to limitations and disadvantages of the related art.

An object of the present invention is to provide a method for fabricating a gate electrode in which a first gate electrode and a second gate electrode are overlapped so that a source and a drain can be independently used and different directions of channels can be used. Therefore, more flexible device design is possible and this independent use of a source and a drain increases space utilization.

To achieve this object, in accordance with the purpose of the invention, as embodied and broadly described herein, a method for fabricating a gate electrode according to the present invention comprises: forming a first gate electrode by etching the first insulating layer and the first polysilicon layer; forming a second insulating layer and a second polysilicon layer on the resulting structure; forming a second gate electrode by etching the second polysilicon layer, wherein the longitudinal axes of the first and second gate electrodes cross each other at a predetermined angle; forming a third insulating layer on the resulting structure; and forming source and drain regions by an ion implantation.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENT

Reference will now be made in detail to the preferred embodiments of the present invention, examples of which are illustrated in the accompanying drawings.

Figure 1A:
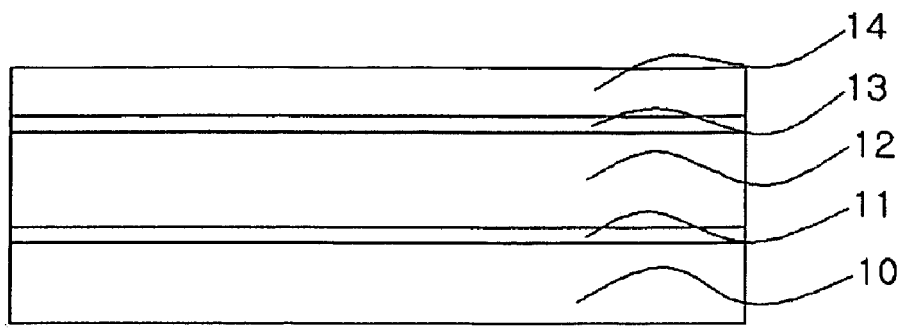
FIG. 1a and FIG. 1b are cross-sectional views illustrating a gate electrode fabrication process of a semiconductor device in accordance with a prior art.
Figure 1B:
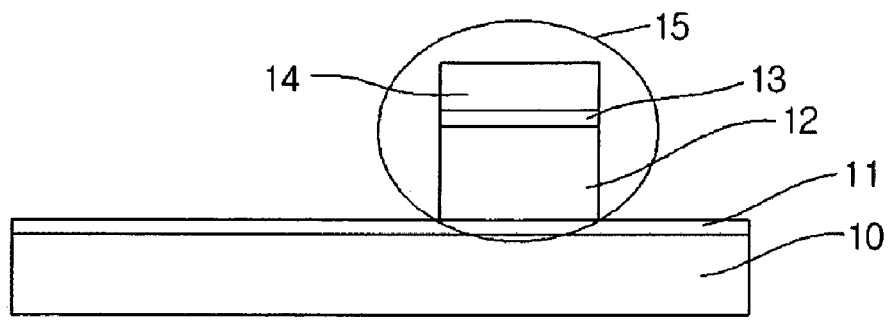
Figure 2A:
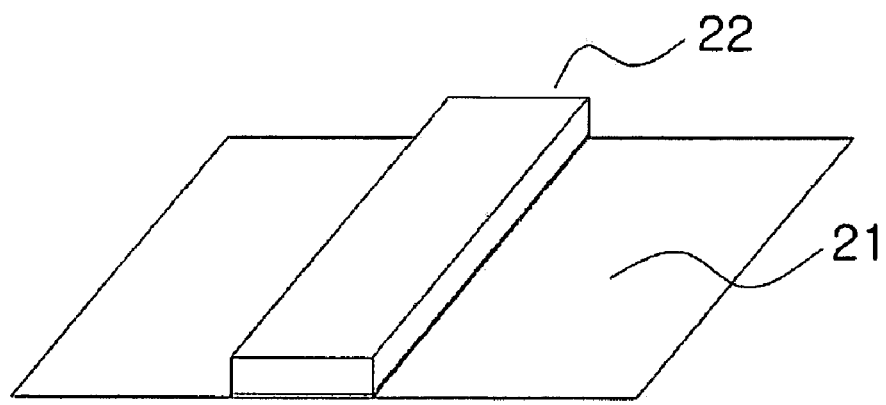
FIG. 2a through FIG. 2g are perspective views illustrating a gate electrode fabrication process of a semiconductor device in accordance with the teachings of the present invention.
Figure 2B:
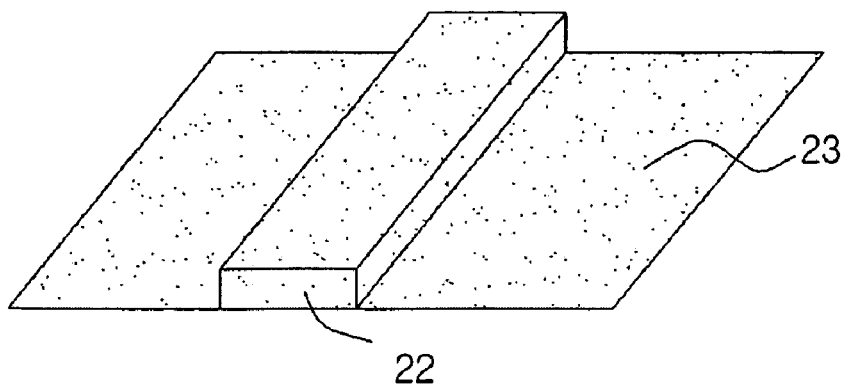
Figure 2C:
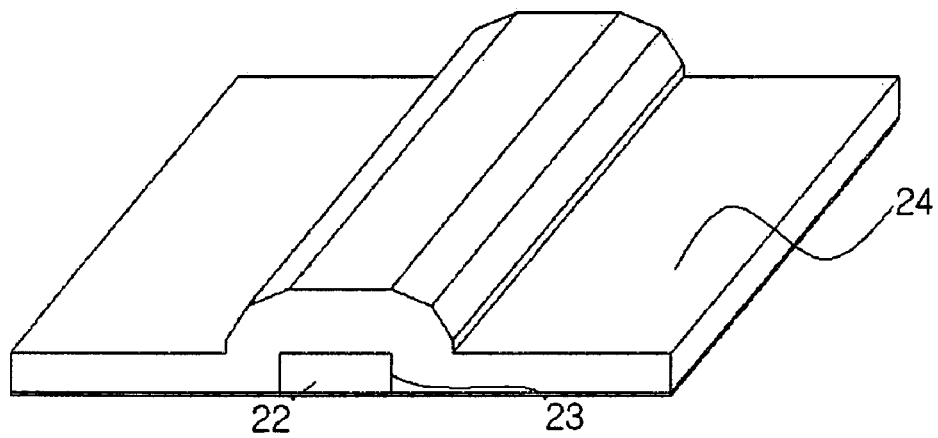
Figure 2D:
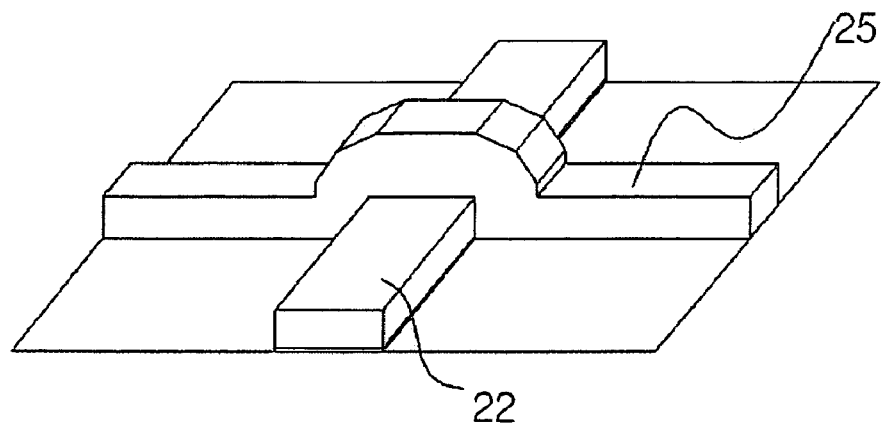
Figure 2E:
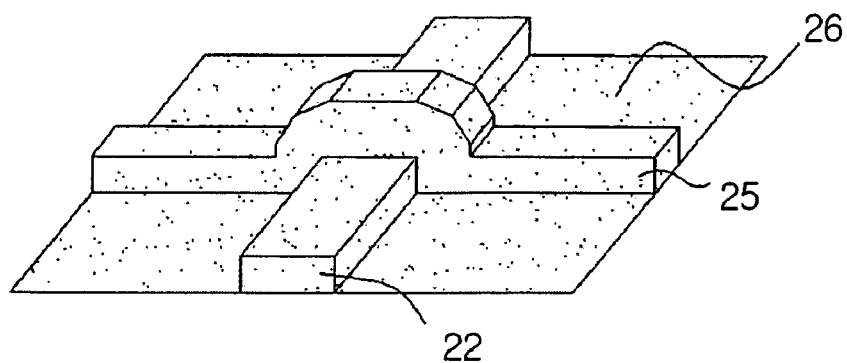
Figure 2F:
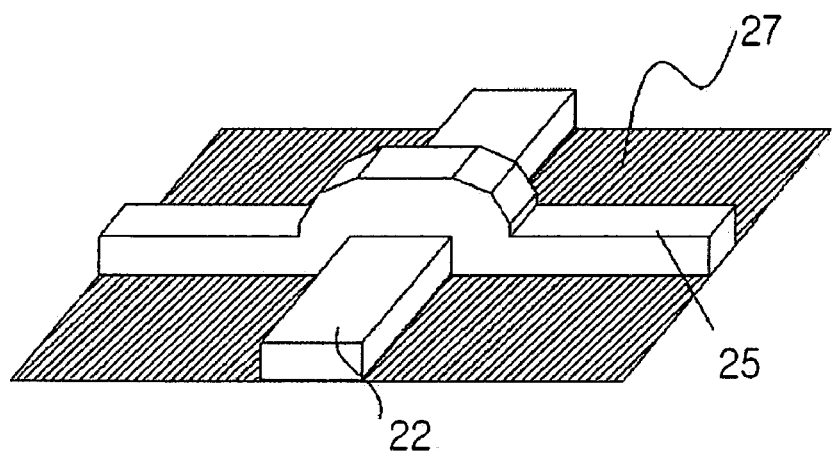
Figure 2G:
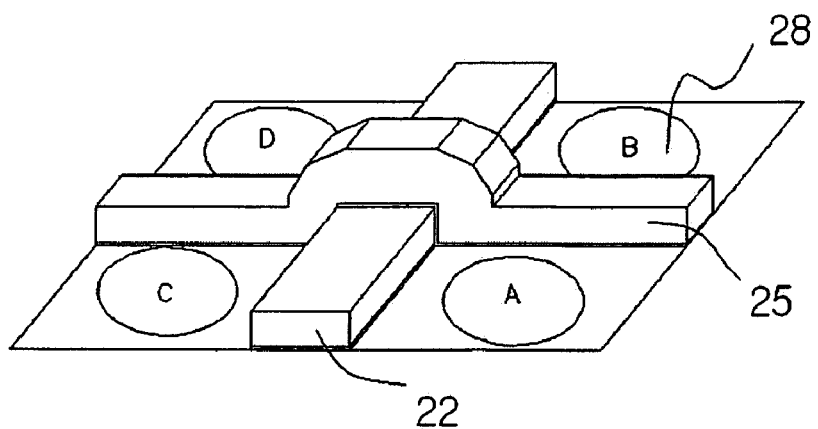
Figure 2H:
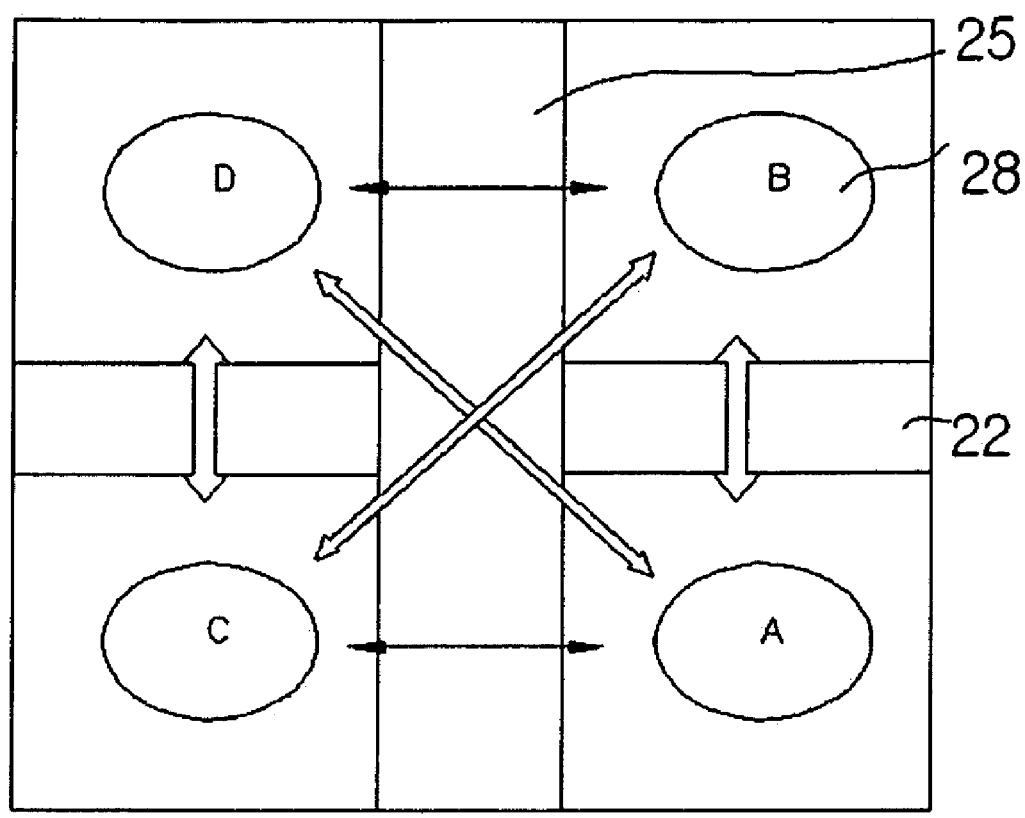
FIG. 2h is a top view illustrating a gate electrode fabrication process of a semiconductor device in accordance with the teachings of the present invention.

FIG. 2a through FIG. 2g are perspective views, and FIG. 2h is a top view illustrating a gate electrode fabrication process in accordance with the teachings of the present invention.

Referring to FIG. 2a, a first insulating layer and a first polysilicon layer are sequentially formed on a substrate 21. The first insulating layer is made of thermal silicon oxide. The first polysilicon layer is coated with a photoresist and a pattern is formed by exposure and development processes. By etching process of the first polysilicon layer and a first insulating layer using this pattern, a first gate electrode 22 is formed.

Referring to FIG. 2b, a second insulating layer is formed on the substrate. To protect or insulate exposed silicon of the sidewall or the surface of the first gate electrode 22 during later processes, the second insulating layer 23 is formed. The second insulating layer 23 is made of thermal silicon oxide by using a thermal oxidation. The second insulating layer 23 should be made in consideration of characteristics of an insulating layer in order to be used as a gate insulating layer of a second gate electrode.

Referring to FIG. 2c, a second polysilicon layer 24 is deposited on the substrate where the first gate electrode and the second insulating layer are formed. The second polysilicon layer 24 is etched in a later process to form a second gate electrode.

Referring to FIG. 2d, by etching the second polysilicon layer 24, a second gate electrode 25 is formed to cross the longitudinal axes of the first and the second gate electrodes at a predetermined angle. The angle between the axes may be varied, but it is preferable that the axes are perpendicular to each other.

Referring to FIG. 2e, a third insulating layer is formed. To protect silicon surface exposed when the second gate electrode is formed, during later processes such as ion implantation which may damage the surface, the third insulating layer 26 is formed. The third insulating layer is made of thermal silicon oxide by using a thermal oxidation.

Referring to FIG. 2f, source and drain regions are formed by an ion implantation into the substrate. Impurities are implanted by using the first gate electrode and the second gate electrode as a mask. The ion implantation forms four source and drain regions 27.

Referring to FIG. 2g, contact holes 28 are formed in each of the four source and drain regions.

Referring to FIG. 2h, a source-drain pair is A-B or C-D with a channel formed on the first gate electrode, A-C or B-D with a channel formed on the second gate electrode or A-D or B-C by controlling both gate electrodes in a proper way. Therefore, total six source-drain combinations can be used by the crossing of the first gate electrode and the second gate electrode.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method for fabricating a semiconductor device comprising:
    forming a first insulating layer and a first polysilicon layer on a semiconductor substrate;
    forming a first gate electrode by etching the first insulating layer and the first polysilicon layer;
    forming a second insulating layer and a second polysilicon layer on the first gate electrode and semiconductor substrate;
    forming a second gaze electrode by etching the second polysilicon layer, wherein the longitudinal axes of the first and second gate electrodes cross ouch other at a predetermined angle, and the first and the second gate electrodes provide six source-drain combinations;
    forming a third insulating layer on the first and second gate electrodes and the semiconductor substrate; and
    forming source and drain regions by an ion implantation into the semiconductor substrate.

2. A method as defined by claim 1, wherein the first, second and third insulating layers comprise thermal oxides.

3. A method as defined by claim 1, wherein the predetermined angle is about 90°.

4. A method as defined by claim 1, wherein the ion implantation forms four source and drain regions.

5. A method as defined by claim 1, wherein the source-drain combinations are determined by controlling the first and second gate electrodes.

6. A method as defined by claim 1, wherein forming the first gate electrode comprises coating the first polysilicon layer with a photoresist and forming a pattern by exposure and development processes.

7. A method as defined by claim 1, wherein the second insulating layer protects or insulates exposed silicon on a sidewall or surface of the first gate electrode.

8. A method as defined by claim 1, wherein the second insulating layer has characteristics of a gate insulating layer for the second gate electrode.

9. A method as defined by claim 1, wherein the first insulating layer comprises a thermal oxide.

10. A method as defined by claim 9, wherein the second insulating layer comprises a thermal oxide.

11. A method as defined by claim 1, wherein the second insulating layer comprises a thermal oxide.

12. A method as defined by claim 11, wherein the third insulating layer comprises a thermal oxide.

13. A method as defined by claim 1, wherein the third insulating layer comprises a thermal oxide.

14. A method as defined by claim 1, wherein the ion implantation forms first and second source regions and first and second drain regions.

* * * * *